United States Patent
Coxe, III et al.

(10) Patent No.: US 12,185,496 B2
(45) Date of Patent: Dec. 31, 2024

(54) LIQUID COOLING MANIFOLD FOR INFORMATION TECHNOLOGY EQUIPMENT

(71) Applicant: Dell Products, L.P., Round Rock, TX (US)

(72) Inventors: William Kenneth Coxe, III, Round Rock, TX (US); Ben John Sy, Austin, TX (US); Daniel Alvarado, Pflugerville, TX (US)

(73) Assignee: Dell Products, L.P., Round Rock, TX (US)

( * ) Notice: Subject to any disclaimer, the term of this patent is extended or adjusted under 35 U.S.C. 154(b) by 258 days.

(21) Appl. No.: 17/813,620

(22) Filed: Jul. 20, 2022

(65) Prior Publication Data
US 2024/0032241 A1 Jan. 25, 2024

(51) Int. Cl.
*H05K 7/20* (2006.01)

(52) U.S. Cl.
CPC ..... *H05K 7/20272* (2013.01); *H05K 7/20254* (2013.01); *H05K 7/20772* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,965,509 B2 * | 6/2011 | Campbell | ............. | H01L 23/473 361/720 |
| 8,027,162 B2 * | 9/2011 | Campbell | ............. | H05K 7/2079 361/716 |
| 8,493,738 B2 * | 7/2013 | Chainer | ............. | H05K 7/20781 361/699 |
| 8,564,951 B1 * | 10/2013 | Watanabe | ................. | G06F 1/20 165/185 |
| 8,913,384 B2 * | 12/2014 | David | ................... | H05K 13/00 361/721 |
| 8,922,998 B2 * | 12/2014 | Campbell | ............. | H05K 7/2079 361/689 |
| 9,009,968 B2 * | 4/2015 | Campbell | .......... | H05K 7/20272 361/699 |
| 9,307,674 B2 * | 4/2016 | Chainer | ............. | H05K 7/20936 |
| 9,313,931 B2 * | 4/2016 | Goth | .................. | H05K 7/20836 |
| 9,414,523 B2 * | 8/2016 | Chainer | ............. | H05K 7/20772 |
| 9,462,728 B2 * | 10/2016 | Demange | ........... | H05K 7/20254 |
| 9,504,184 B2 * | 11/2016 | Krug, Jr. | ............ | H05K 7/20218 |

(Continued)

*Primary Examiner* — Lisa Lea-Edmonds
(74) *Attorney, Agent, or Firm* — Fogarty LLP

(57) ABSTRACT

An information technology equipment enclosure comprises a plurality of IT components, cold plates disposed over at least two of the IT components, and a cooling fluid manifold disposed within the IT equipment enclosure. The coolant liquid manifold has multiple input connectors and multiple output connectors. Each of the cold plates are coupled to the cooling fluid manifold using a coolant line attached to one of the input connectors and a coolant line attached to one of the output connectors. An input cooling liquid line couples the coolant liquid manifold to an output of an external liquid cooling system, and an output liquid line couples the coolant liquid manifold to an input of the external liquid cooling system. The coolant liquid manifold is configured to receive cooling fluid from the external liquid cooling system and to distribute the cooling fluid to all of the cold plates via the input connectors.

19 Claims, 8 Drawing Sheets

(56) References Cited

U.S. PATENT DOCUMENTS

| | | | |
|---|---|---|---|
| 9,795,065 B2* | 10/2017 | Shelnutt | H05K 7/20781 |
| 9,839,164 B2* | 12/2017 | Shelnutt | H05K 7/20772 |
| 9,930,807 B2* | 3/2018 | Chainer | H05K 7/20772 |
| 9,936,607 B2* | 4/2018 | Chainer | H05K 7/20336 |
| 10,156,873 B2* | 12/2018 | Shelnutt | H05K 7/20809 |
| 10,172,262 B2* | 1/2019 | Shelnutt | H05K 7/20781 |
| 10,206,312 B2* | 2/2019 | Shelnutt | H05K 7/2079 |
| 10,385,996 B2* | 8/2019 | Arvelo | F15D 1/00 |
| 10,422,451 B2* | 9/2019 | Arvelo | H05K 7/20772 |
| 10,582,639 B1* | 3/2020 | Chopra | H05K 7/20636 |
| 10,595,447 B2* | 3/2020 | Campbell | H05K 7/2079 |
| 10,617,042 B2* | 4/2020 | Shelnutt | H05K 7/20772 |
| 10,917,998 B2* | 2/2021 | Shelnutt | H05K 7/20772 |
| 11,019,752 B2* | 5/2021 | Gao | H05K 7/20781 |
| 11,191,185 B2* | 11/2021 | Chopra | H05K 7/20636 |
| 11,659,685 B2* | 5/2023 | Carver | H05K 7/20272 |
| | | | 361/688 |
| 11,752,608 B2* | 9/2023 | Kelly | H01R 43/26 |
| | | | 29/764 |
| 11,877,428 B2* | 1/2024 | Hogan | H05K 7/20781 |
| 11,963,338 B2* | 4/2024 | Edmunds | H05K 7/20772 |
| 2007/0125523 A1* | 6/2007 | Bhatti | H05K 7/20772 |
| | | | 165/80.4 |
| 2007/0297136 A1* | 12/2007 | Konshak | H05K 7/20781 |
| | | | 361/699 |
| 2013/0091706 A1* | 4/2013 | Campbell | H05K 7/20627 |
| | | | 29/890.03 |
| 2014/0146467 A1* | 5/2014 | Campbell | H05K 7/203 |
| | | | 361/699 |
| 2014/0146468 A1* | 5/2014 | Campbell | H05K 7/20809 |
| | | | 361/699 |
| 2016/0113149 A1* | 4/2016 | Krug, Jr. | H05K 7/20781 |
| | | | 165/173 |
| 2016/0341342 A1* | 11/2016 | Arvelo | H05K 7/20772 |
| 2016/0345466 A1* | 11/2016 | Arvelo | H05K 7/20627 |
| 2017/0177041 A1* | 6/2017 | Shelnutt | H05K 7/20809 |
| 2017/0181323 A1* | 6/2017 | Shelnutt | H05K 7/20772 |
| 2018/0092254 A1* | 3/2018 | Shelnutt | H05K 7/20772 |
| 2018/0279510 A1* | 9/2018 | Johnson | H05K 7/20772 |
| 2018/0303007 A1* | 10/2018 | Gao | H05K 7/20781 |
| 2019/0124797 A1* | 4/2019 | Norton | H05K 7/20172 |
| 2019/0150326 A1* | 5/2019 | Gao | H05K 7/20745 |
| | | | 361/679.47 |
| 2020/0146188 A1* | 5/2020 | Shelnutt | H05K 7/20781 |
| 2020/0163251 A1* | 5/2020 | Chopra | H05K 7/20636 |
| 2022/0039291 A1* | 2/2022 | Chopra | H05K 7/20636 |
| 2022/0071063 A1* | 3/2022 | Heydari | H05K 7/20772 |
| 2022/0124942 A1* | 4/2022 | Tan | H05K 7/20272 |
| 2022/0338384 A1* | 10/2022 | Hogan | H05K 7/20781 |
| 2022/0369514 A1* | 11/2022 | Heydari | H05K 7/20836 |
| 2022/0390195 A1* | 12/2022 | Gao | F28F 27/02 |
| 2023/0018736 A1* | 1/2023 | Tsai | H05K 7/20772 |
| 2023/0085165 A1* | 3/2023 | Gao | H05K 7/1489 |
| | | | 361/699 |
| 2024/0011809 A1* | 1/2024 | Curtis | G01F 1/075 |

* cited by examiner

LIQUID COOLING MANIFOLD FOR INFORMATION TECHNOLOGY EQUIPMENT

FIELD

The present disclosure generally relates to Information Handling Systems and, more particularly, to a liquid cooling manifold for an information technology enclosure.

BACKGROUND

An Information Handling System (IHS) generally processes, compiles, stores, and/or communicates information or data for business, personal, or other purposes. IHSs may include a variety of hardware and software components that are configured to process, store, and communicate information and may include one or more computer systems, data storage systems, and networking systems. Groups of IHSs may be housed within data center environments. A data center may include a large number of IHSs, such as server chassis that are stacked and installed within racks. A data center may include large numbers of such server racks that are organized into rows of racks. Administration of such large groups of IHSs may require teams of remote and local administrators working in shifts in order to support around-the-clock availability of the data center operations while minimizing any downtime.

As IHS components such as processors, graphics cards, random access memory (RAM), etc. have increased in clock speed and power consumption, the amount of heat produced by such components during normal operation has also increased. Often, the temperatures of these components need to be kept within a selected range to prevent overheating, instability, malfunction, and damage that would lead to a shortened component lifespan and lowered datacenter reliability. Accordingly, cooling systems often been used in IHSs to cool certain components. To control the temperature of components of an IHS, an approach may include using a "passive" cooling system that serves to reject heat of a component to air driven by one or more system-level air movers (e.g., fans, blowers, etc.). A different approach may include using an "active" cooling system in which a heat-exchanging cold plate is thermally coupled to the IHS component, and a chilled fluid is passed through conduits internal to the cold plate to remove heat from that component.

SUMMARY

In an example embodiment, an information technology equipment enclosure comprises a plurality of IT components, cold plates disposed over at least two of the IT components, and a cooling fluid manifold disposed within the IT equipment enclosure. The coolant liquid manifold has two or more input connectors and two or more output connectors. Each of the cold plates are coupled to the cooling fluid manifold using a coolant line attached to one of the input connectors and a coolant line attached to one of the output connectors. An input cooling liquid line couples the coolant liquid manifold to an output of an external liquid cooling system, and an output liquid line couples the coolant liquid manifold to an input of the external liquid cooling system. The coolant liquid manifold is configured to receive cooling fluid from the external liquid cooling system and to distribute the cooling fluid to all of the cold plates in the enclosure via the input connectors. The coolant liquid manifold is configured to receive warmed cooling fluid from all of the cold plates in the enclosure and to send the warmed cooling fluid to the external liquid cooling system.

The input connectors and the output connectors may be quick disconnect fittings adapted to be coupled to coolant lines routed to the cold plates. The input connectors may be a first type of quick disconnect fitting and the output connectors a second type of quick disconnect fitting, where the first and second type of quick disconnect fittings are not interchangeable. The first type of quick disconnect fitting is selected from a male or female fitting, and the second type of quick disconnect fitting is an opposite type of female or male fitting.

The amount of cooling fluid provided by the coolant liquid manifold to individual cold plates may be determined by a size of an associated input connector. The amount of cooling fluid provided by the coolant liquid manifold to individual cold plates may be also or alternatively be determined by an orifice restriction applied to an associated input connector.

The IT components may be one or more of a Central Processing Unit (CPU), Graphics Processing Unit (GPU), a compute module, and a switch module. The IT equipment may further comprise a fluid splitter coupled to an input connection on the coolant liquid manifold, wherein the fluid splitter has two or more outputs, a first cold plate coupled to a first output of the fluid splitter, and a second cold plate coupled to a second output of the fluid splitter. The fluid splitter is configured to divide cooling liquid from the coolant liquid manifold between the first cold plate and second cold plate.

In another example embodiment, a computing rack comprises a frame structure configured for mounting one or more chassis, each chassis configured for mounting IT components. A liquid cooling system is configured to provide cooling fluid to the one or a plurality of IT components. The computing rack includes at least one of the one or more chassis comprising cold plates disposed over the IT components and a cooling fluid manifold disposed within the chassis. The coolant liquid manifold has a plurality of input connectors and a plurality of output connectors. Each of the cold plates are coupled to an input connector and an output connector on the cooling fluid manifold using a coolant line attached to one of the input connectors and a coolant line attached to one of the output connectors.

The computing rack may further comprise input lines coupling the liquid cooling system to the input connector on each coolant liquid manifold, where the coolant liquid manifold is configured to receive cooling fluid from the liquid cooling system, and output lines coupling the output connector on each coolant fluid manifold to the liquid cooling system, where the coolant liquid manifold is configured to provide the cooling fluid to the liquid cooling system after passing through the cold plates.

The coolant liquid manifold may be configured to receive warmed cooling fluid from all of the cold plates in the enclosure and to send the warmed cooling fluid to the liquid cooling system. The input connectors and the output connectors may be quick disconnect fittings adapted to be coupled to coolant lines routed to the cold plates. The input connectors may be a first type of quick disconnect fitting and the output connectors may be a second type of quick disconnect fitting, where the first and second type of quick disconnect fittings are not interchangeable.

The amount of cooling fluid provided by the coolant liquid manifold to individual cold plates may be determined by a size of an associated input connector. The amount of cooling fluid provided by the coolant liquid manifold to individual cold plates may be determined by an orifice restriction applied to an associated input connector.

The computing rack may further comprise a fluid splitter within at least one chassis. The fluid splitter may be coupled to an input connection on the coolant liquid manifold, wherein the fluid splitter has two or more outputs. A first cold plate within the at least one chassis is coupled to a first output of the fluid splitter, and a second cold plate within the at least one chassis is coupled to a second output of the fluid splitter. The fluid splitter may be configured to divide cooling liquid from the coolant liquid manifold between the first cold plate and second cold plate.

BRIEF DESCRIPTION OF THE DRAWINGS

The present invention(s) is/are illustrated by way of example and is/are not limited by the accompanying figures. Elements in the figures are illustrated for simplicity and clarity and have not necessarily been drawn to scale.

DETAILED DESCRIPTION

Figure 1:
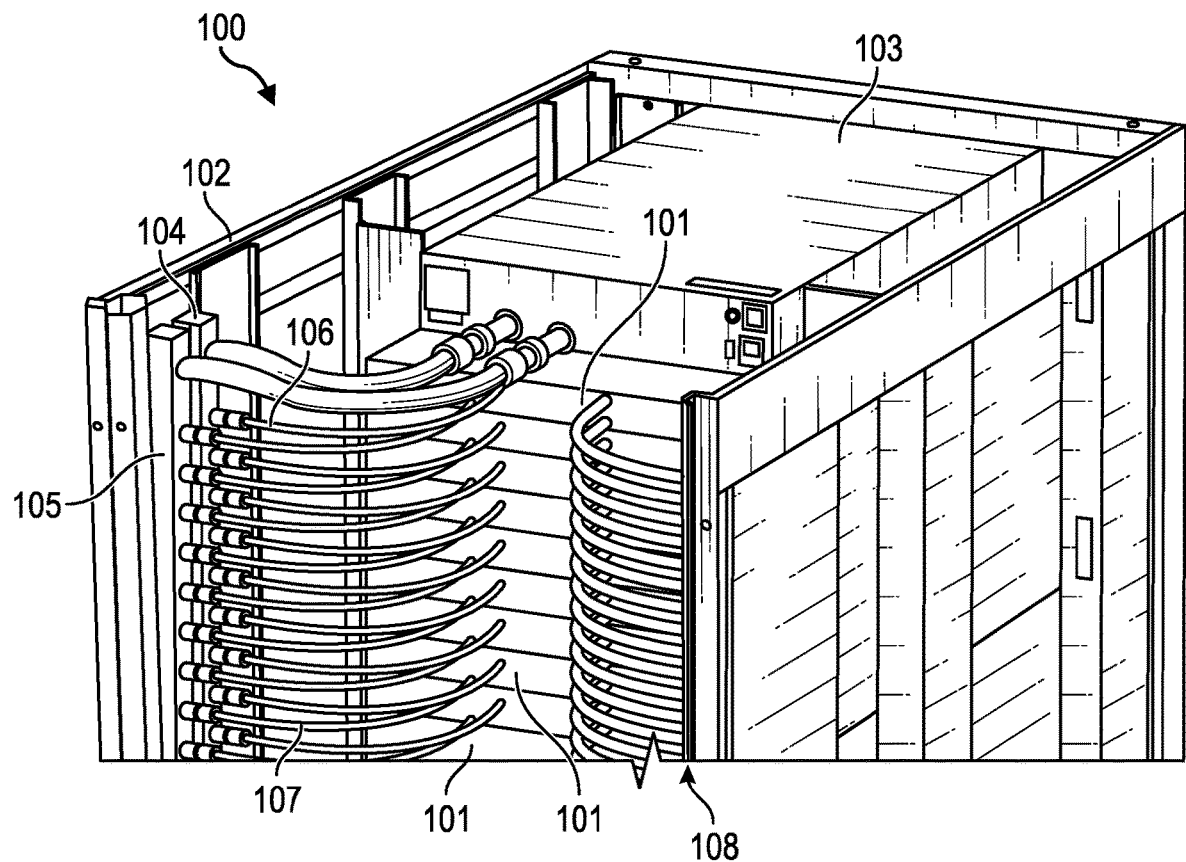
FIG. 1 is a partial, perspective view illustrating an example computing rack that may be used to mount one or more information technology enclosures according to an example embodiment.

The illustrative embodiments provide various aspects of a modular chassis design and for use with a rack assembly. The chassis has height, depth, and width dimensions that enable insertion of a plurality of different sizes of IT gear in IT enclosures.

In the following detailed description of exemplary embodiments, it is to be understood that the specific details presented need not be utilized to practice embodiments of the present disclosure. It is also to be understood that other embodiments may be utilized, and that logical, architectural, programmatic, mechanical, electrical, and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments," or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not for other embodiments.

It is understood that the use of specific component, device, and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures and described herein may vary. For example, the illustrative components within the example chassis are not intended to be exhaustive, but rather are representative to highlight components that can be utilized to implement various aspects of the present disclosure. For example, other devices, components, or modules may be used in addition to or in place of the hardware and software modules depicted. The depicted examples do not convey or imply any architectural or other limitations with respect to the presently described embodiments and/or the general disclosure.

FIG. 1 is a partial, perspective view illustrating an example computing rack 100 that may be used to mount one or more IT enclosures 101, such as information technology chassis, according to an example embodiment. The IT enclosures 101 may support information handling systems, such as servers. Rack-based information handling systems enable larger scale systems to be deployed in a single structure, such as a rack 100. These racks can hold a plurality of individual servers or server nodes (generally, "information technology (IT) gear"), which can be fully functional units. These individual units may function as self-managed systems and are thus each equipped with individual cooling and power controls and localized system management, independent of other systems within the rack. These IT gear are also designed to fit within the specific rack configuration and are typically of a standard width and depth dimension to fit within the rack structure. Also, depending on the particular rack, the IT gear are design with a standard uniform height that is determined solely by the pre-determined singular height of IT gear the specific rack is design to have inserted therein.

Computing rack 100 includes a frame structure 102, such as side panels with rails or brackets, for mounting multiple IT enclosures 101. The frame structure 102 may also be used to mount a liquid recirculation system 103 that pumps chilled liquid through a liquid cooled segment (not shown) in each IT enclosures 101. Liquid recirculation system 103 cools heated liquid that is returned from the IT enclosures 101.

The IT enclosures 101 may be dimensioned to fit in any suitable type and size of computing rack 100. Examples of suitable computing racks 100 that IT enclosures 101 may be dimensioned for include racks that are generally referred to as 19-inch (482.6 mm) racks or 23-inch (584.2 mm) racks. The 19-inch racks may be constructed according to various specifications, such as the Electronics Industries Alliance 310-D (EIA 310D) specification. Although 23-inch racks are often used by the telecommunication industry, 19-inch racks may be relatively more common with other computing system implementations. In general, these computing racks typically comprise a structure in which one or more IT enclosures 101 and other equipment modules may be mounted.

Computing rack 100 includes an inlet coolant manifold 104 for distributing cooled liquid from liquid recirculation system 103 to IT enclosures 101 and an outlet coolant manifold 105 for receiving heated liquid from IT enclosures 101. Inlet manifold fluidly couples an outlet of liquid recirculation system 103 to the inlet tube 106 for each IT enclosure 101. Outlet manifold 105, on the other hand, fluidly couples an inlet of liquid recirculation system 103 to the outlet tube 107 of each IT enclosure 101. Thus, inlet manifold 104 and outlet manifold 105 enable the cooling of multiple IT enclosures 101 to be provided by a single cooling source (e.g., liquid recirculation system 103). While all IT enclosures 101 configured in computing rack 100 are shown to be provided by a single liquid recirculation system 103, it should be appreciated that, in other embodiments, each IT enclosures 101 may be individually provided by a corresponding number of multiple cooling sources.

Computing rack 100 may have additional components (not shown), such as power modules and management module to provide rack-level power and management. Cabling 108 may provide connections to each IT enclosure 101 for power, Ethernet, or other networking, management, or control connections.

Figure 2A:
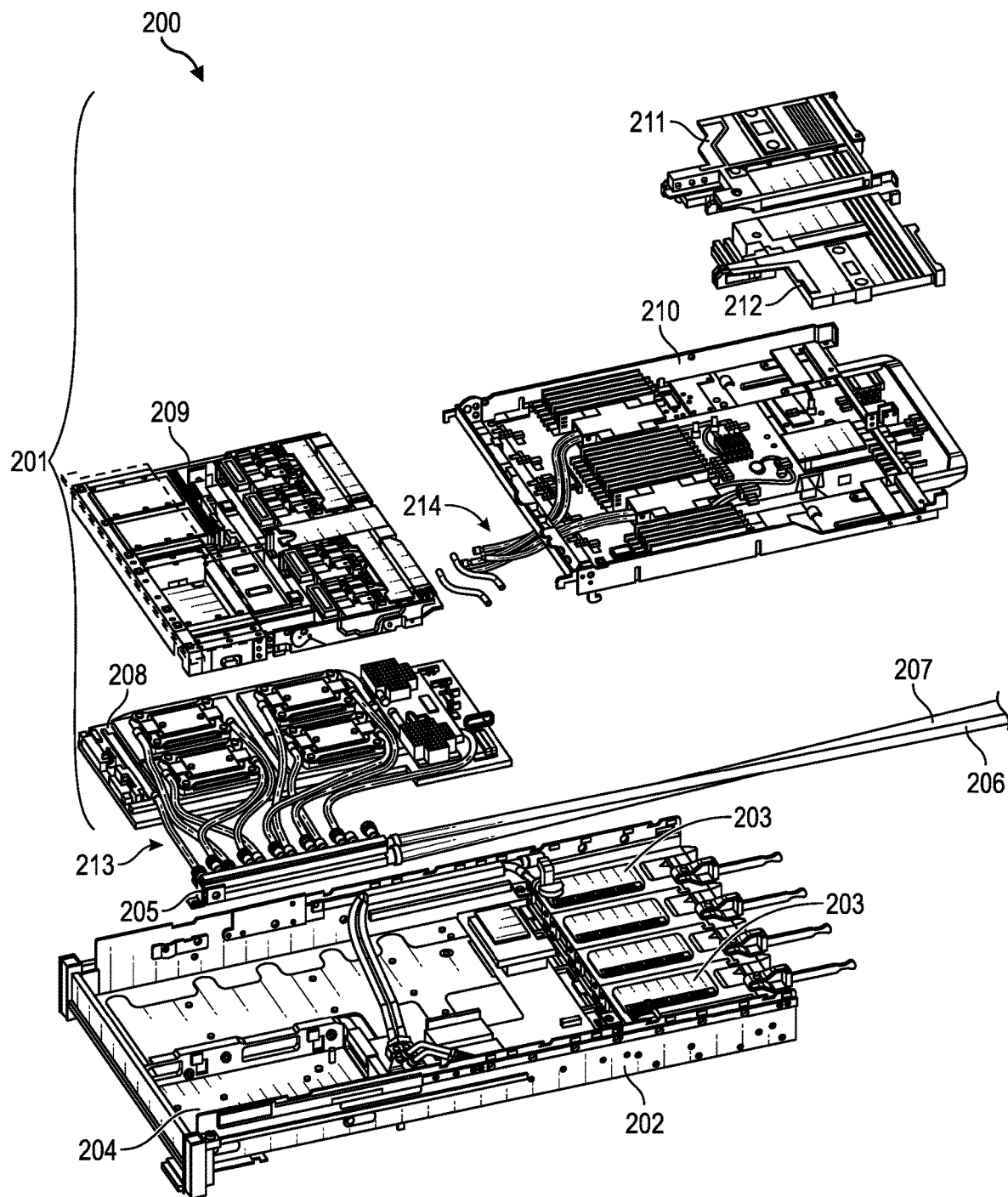
FIG. 2A is an exploded view showing components of an example IT enclosure.
Figure 2B:
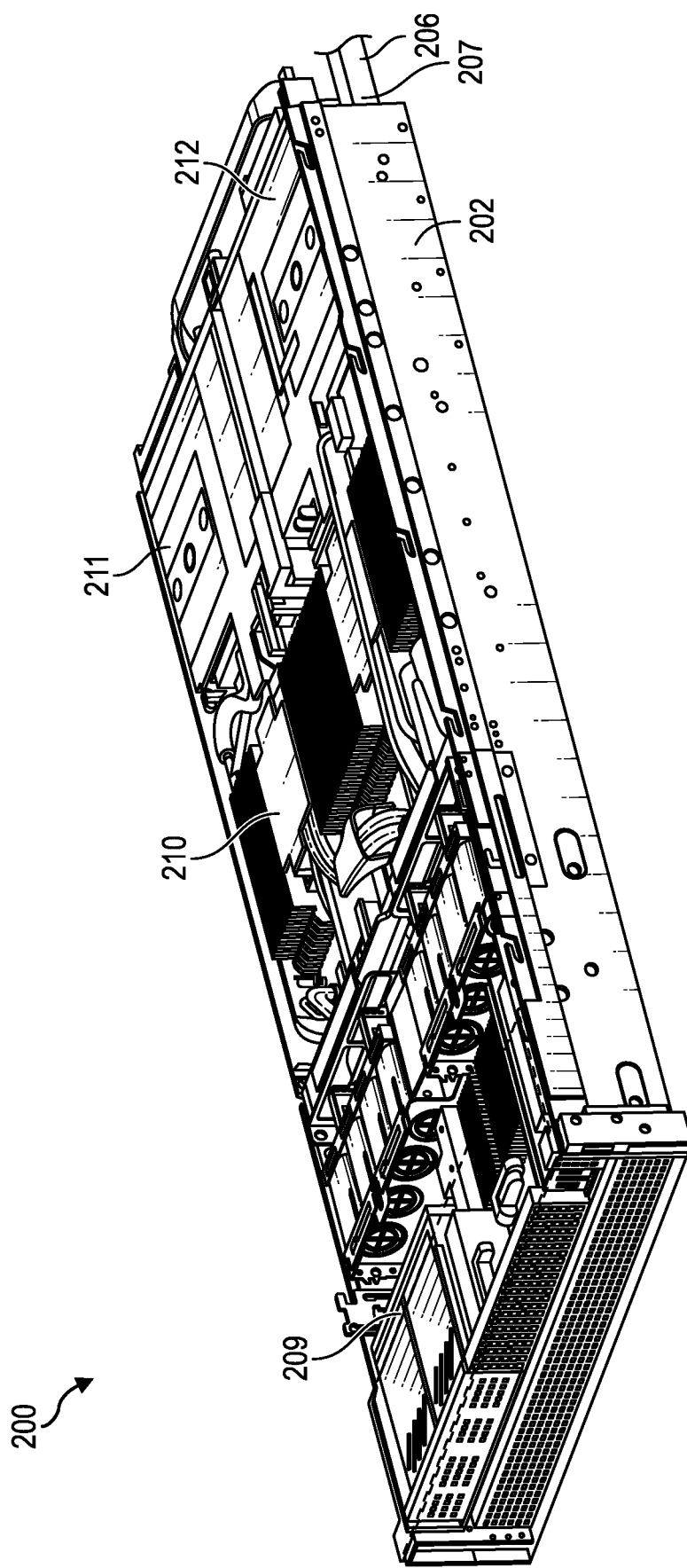
FIG. 2B illustrates the components shown in FIG. 2A combined into the IT enclosure.

FIGS. 2A and 2B illustrate an example IT enclosure 200 having a number of components 201, which are shown as an exploded view in FIG. 2A and as a deployed configuration in FIG. 2B. IT enclosure 200 may be used for an IHS. For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a handheld device, personal computer, a server, a network storage device, or any other suitable device and may vary in size, shape, performance, functionality, and price. The information handling system may include one or more processing resources (such as a Central Processing Unit (CPU), Graphics Processing Unit (GPU), or hardware or software control logic), Random Access Memory (RAM), Read Only Memory (ROM), and/or other types of nonvolatile or volatile memory. Additional components of the information handling system may include one or more disk drives, one or more network ports for communicating with external devices as well as various input and output (I/O) devices, such as a keyboard, a mouse, and a video display. The IHS may also include one or more buses operable to transmit communications between the various hardware components.

IT enclosure 200 includes a chassis 202 configured to hold infrastructure components 201. Chassis 202 has a width and length that are sized as appropriate for mounting in a rack assembly, such as rack 100 (FIG. 1). Chassis 202 in the illustrated example has a height of two rack units. As utilized herein, a rack unit (U or RU) is a unit of measure that describes the height of equipment designed to mount in a 19-inch rack or a 23-inch rack. The width of the equipment that can be mounted inside the rack is less that the width of the mounting frame, but different widths may be supported. One rack unit is 1.75 inches (44.45 mm) high. A 19-inch rack is a standardized frame or enclosure for mounting multiple equipment modules. Each IT enclosure 200 has a front panel that is substantially 19 inches wide, including edges or ears that protrude on each side to allow the module to be fastened to the rack frame with screws.

Components 201 are arranged on two levels in chassis 202, where each level is one rack unit high. A lower level includes power supply units 203, a cooling liquid line routing apparatus 204, a cooling liquid manifold 205, input cooling liquid line 206, output liquid line 207, and a GPU module 208 shown with four GPUs. An upper level includes a storage module 209, a CPU module 210, and first and second Peripheral Component Interconnect Express (PCIe) riser cards 211, 212 for connecting data signals to components 201.

The Thermal Design Power (TDP) for an IT component is the maximum amount of power/heat that a cooling system needs to dissipate for that component. TDPs for IT components have increased with each generation. This has resulted in the implementation of direct liquid cooling instead of relying only on air cooling for IT components. Liquid cooling systems transfer heat up to four times faster than an equal mass of air, which allows for higher performance cooling to be provided with a smaller system. A liquid cooled cold plate can replace the space consumed by heat sinks and fans. Pumps, heat exchangers, tubing, and plates that are required for liquid cold plates can be placed outside the airflow. Liquid cold plates may be used to cool components, such as CPUs and GPUs, with a high power consumption and a high TDP. As components within an IT enclosure reach the limits of air cooling, more and more liquid cold plates are required inside the chassis. Each of these cold plates require coolant lines 213, 214 to deliver cold liquid to the cold plate and to remove heated liquid from the cold plate.

In existing IT enclosures, discrete cold plate loops are used for each component with a high TDP. The loops in the existing IT enclosures are coupled directly to a rack-level cooling manifold 104, 104 (FIG. 1). These discrete cooling loops are problematic as more and more components require cold plates and, therefore, the number of connections to the rack-level manifold increase. This requires access to many loops in the rack and requires space inside the chassis to run loops to the rack-level manifold. IT enclosure 200 removes all of the discrete cooling loops by incorporating an in-chassis fluid distribution network to address many of the issues found in existing IT enclosures.

The coolant distribution network in IT enclosure 200 supplies cooling fluid to multiple internal components, such as the processors on GPU module 208 and CPU module 210. The coolant distribution network is comprised of multiple branches of coolant loops 213, 214 aggregated into a common manifold 205. Each coolant branch serves a family of thermally similar components. The common manifold 205 is fed by a single rack-level input cooling liquid line 206 and a single output liquid line 207, which exit IT enclosure and are connected to rack-level manifolds 104, 105. Each branch of the coolant loop is connected to manifold 205 via its own dripless quick disconnect for ease of assembly, failure isolation, and servicing. Each branch can be tuned to the liquid coolant flow requirements of a given component to make the most efficient use of the gross flow to IT enclosure manifold 205 from the rack-level manifold 104.

Figure 3:
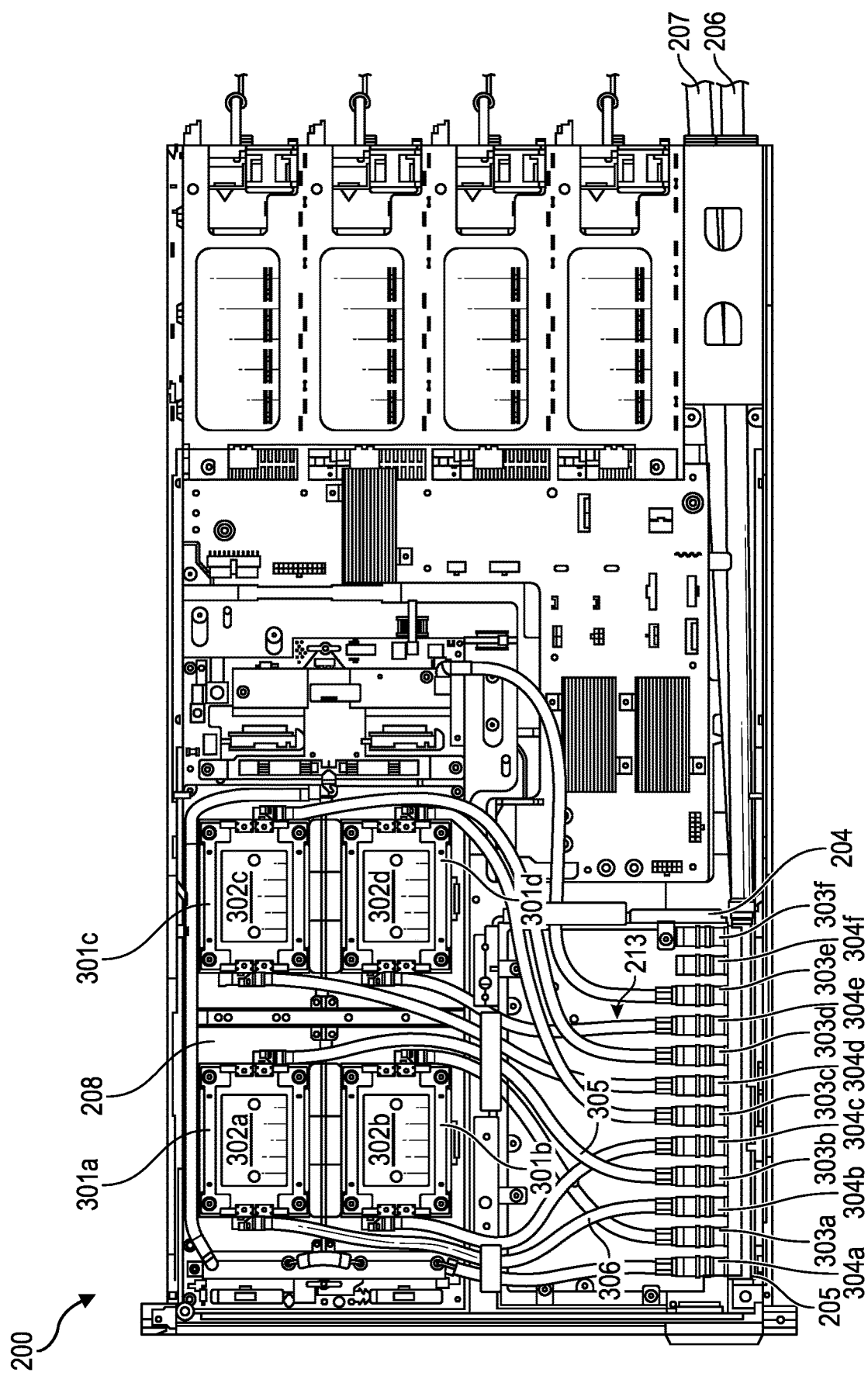
FIG. 3 is a top view illustrating components mounted in the bottom level of IT enclosure including a cooling liquid manifold.

FIG. 3 is a top view illustrating components mounted in the bottom level of IT enclosure 200. GPU module 208 has four GPUs 301a-d and each has a corresponding cold plate 302a-d. Cold plates 302a-d function as heat exchangers and may comprise any system, device, or apparatus that is configured to thermally couple to IT component to transfer heat energy from the component to a cooling fluid within the cold plate. In other embodiments, cold plates 302a-d may instead comprise bare-die or direct-contact fluid immersion heat exchangers. Thus, in operation, heat present in an IT component, such as GPUs 301a-d, may be thermally conducted through cold plates 302a-d and thermally transferred to a fluid present in coolant lines 213. Cold plates 302a-d may be constructed from extruded aluminum, machined aluminum, case aluminum, and/or another suitable material that is generally thermally conductive. The coolants used for liquid cooling application may include, for example, water, deionized water, ethylene glycol and water solutions, propylene glycol and water solutions, or polyalphaolefin liquid.

The position, length, height, width, and other physical characteristics of cold plates 302a-d and coolant lines 213 may be selected based on desired cooling characteristics, desired fluid flow rates, desired fluid type, component types, component locations, expected component heat generation, and/or any other suitable characteristics of a corresponding IT enclosure 200.

IT enclosure manifold 205 has six input connections 303a-f and six output connections 304a-f. Connections 303a-f and 304a-f may be quick disconnect fittings that that allow each coolant line 213 to be easily attached or disengaged, which simplifies servicing of the IT enclosure 200, components 201, and/or the cooling system. Liquid coolant is received at IT enclosure 200 via input cooling liquid line 206, which provides the liquid to manifold 205 for distribution to coolant lines via connections 303a-f. The cooling fluid flows through a first coolant lines to an associated cold plate where heat is transferred from an attached IT components to the cooling fluid. The warmed fluid is then passed back to manifold 205 via second coolant line where it is received via an associated connection 304a-f and passed out of the IT enclosure via output liquid line 207. For example, GPU processor 301a is cooled by fluid passing through connection 303b and line 305 to cold plate 302a. After the fluid is warmed by thermal transfer from GPU 301a, the warmed fluid is passed through line 306 and connection 304b. A line routing apparatus 204 may be used to manage the position and routing of coolant lines 213.

In the illustrated embodiment, input connections 303a-d are configured to provide cooling fluid to cold plates 302a-d, and output connections 304b-e are configured to receive warmed fluid from cold plates 302a-d. Input connection 303e and output connection 304a may be used to provide cooling liquid to other components of IT enclosure 200, such as CPU module 210 via lines 214. Further, an additional pair of connections (input connection 303f and output connection 304f) are not used but allow for future expansion in IT enclosure 200 to add other components that require liquid cooling. Although the example manifold 205 illustrated in FIG. 3 has six input connections 303a-f and six output connections 304a-f, it will be understood that any number of input connections and output connections may be provided in other embodiments.

Figure 4A:
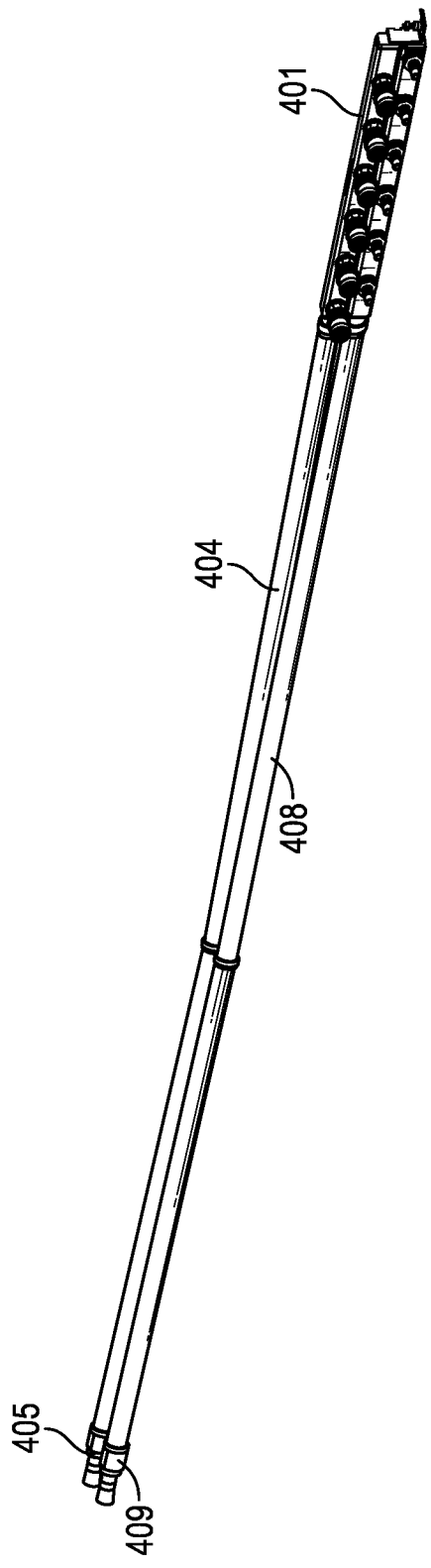
FIGS. 4A-C are detailed perspective views illustrating a cooling liquid manifold according to an example embodiment.
Figure 4B:
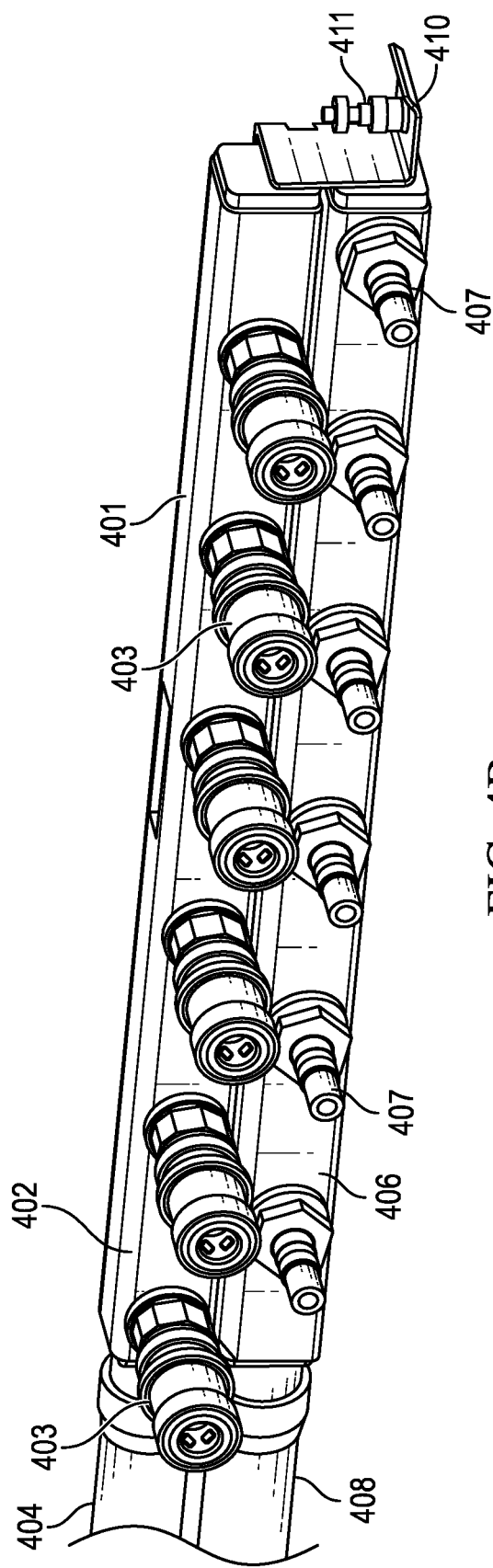
Figure 4C:
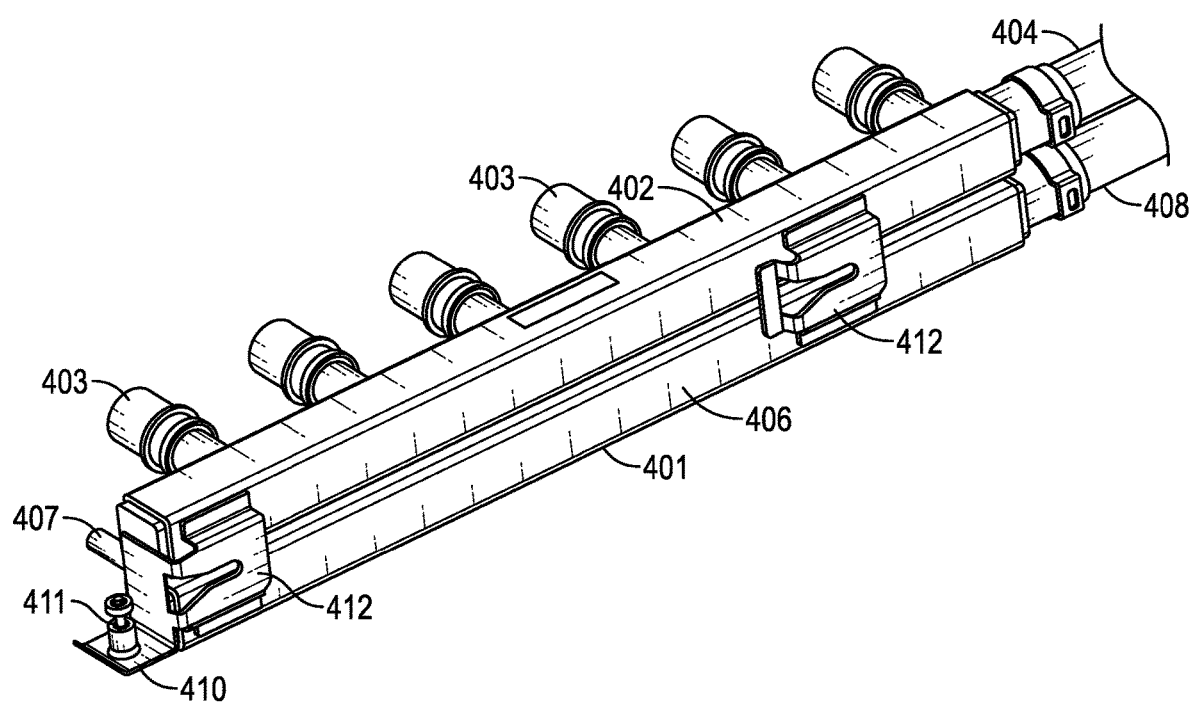

FIGS. 4A-C are detailed views illustrating a cooling liquid manifold 401 according to an example embodiment. Manifold 401 comprises two isolated sections. An upper section 402 has a plurality of female quick connect fittings 403. Upper section 402 is coupled to an input cooling liquid line 404, which in turn is coupled to a rack-level inlet coolant manifold (not shown) at a quick connect fitting 405. Upper section 402 and connectors 403 are configured to distribute liquid coolant from a rack-level liquid recirculation system (not shown) to components of an IT enclosure in which manifold 401 is installed.

A lower section 406 of manifold 401 has a plurality of male quick connect fittings 407. Lower section 406 is coupled to an output cooling liquid line 408, which in turn is coupled to a rack-level outlet coolant manifold (not shown) at quick connect fitting 409. Lower section 406 and connectors 407 are configured to receive warmed liquid from components of the IT enclosure and to send the warmed fluid to the rack-level liquid recirculation system where the fluid will be cooled and recirculated back to the upper section 402.

Manifold 401 may be mounted to a line routing apparatus (e.g., apparatus 204, FIG. 2) or to a sidewall of an IT enclosure chassis. In one embodiment, manifold 401 is attached to the IT enclosure using one or more brackets 410 and fasteners 411, which may be rivets, screws, or any other appropriate device for attaching a bracket to an IT enclosure. Additionally, or alternatively, manifold 401 may be attached to the line routing apparatus or to the sidewall of the chassis using brackets 412 that may be engaged onto posts or other appropriate fixtures on the IT enclosure to ensure proper positioning and alignment of the manifold 401. Bracket 410 and clips 412 allow manifold 401 to be easily exchanged to match the components installed with the IT enclosure.

The upper and lower sections 402, 406 and the quick connect fittings 403, 407 may be tuned to control the flow of coolant liquid to various component types. This allows components with a higher TDP to receive more coolant liquid than components with a lower TDP using the same manifold. For example, the amount of coolant fluid may be managed by fitting sizing or using orifice restrictions in the fittings.

Opposite fitting types are used for input and output connections (e.g., female for input, male for output, or vise versa) so that there is no risk of connecting a line to the wrong section of manifold 401. Inlet lines will only connect to the input fittings, and outlet lines will only connect to the outlet fittings. Additional or spare fittings 403, 407 may be included on manifold 401 to allow for future expansion of the IT enclosure, such as if additional processors are added that require cold plates for a thermal solution.

By consolidating all of the quick connect fittings 403, 407 in one location with manifold 401, the system consolidates may failure points to a single location, which makes fault analysis and service easier than if the connections were distributed. This minimizes disruption to other parts of the system and minimizes the impacted area.

Figure 5:
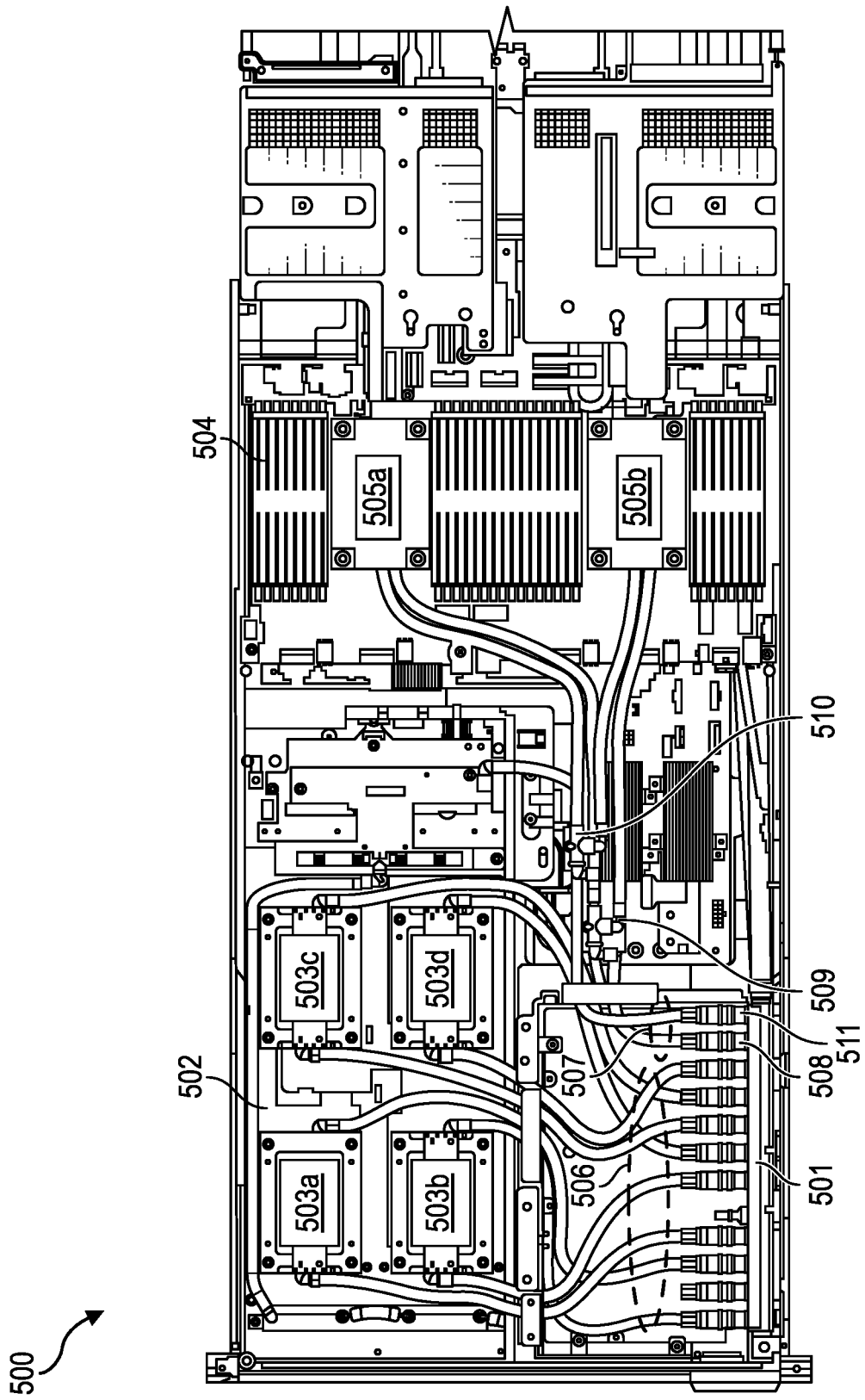
FIG. 5 is a top view of an IT enclosure illustrating a cooling liquid manifold configuration according to an example embodiment.

FIG. 5 is a top view of an IT enclosure 500 illustrating a cooling liquid manifold configuration according to an example embodiment. IT enclosure 500 has a liquid cooling manifold 501 with six pairs of input/output fittings. A GPU module 502 has four GPUs with cold plates 503a-d. A separate CPU module 504 has two CPUs with cold plates 505a-b. GPU module 502 and CPU module 504 may be on the same level within IP enclosure 500 or on different levels, such as if CPU module 504 is on an upper level and GPU module 502 is on a lower level. The internal liquid cooling manifold 501 provides flexibility for supporting different types of components, such as GPUs and CPUs that may have different power requirements and different thermal solutions.

As illustrated in FIG. 5, manifold 501 has four pairs of input/output coolant lines 506 servicing the GPU cold plates 503a-d. Each cold plate 503a-d is coupled to a dedicated input coolant line and a dedicated output coolant line. On the other hand, only one pair of lines 507 is required to service CPU cold plates 505a-b. Input quick connect fitting 508 is coupled to a single line that is in turn coupled to a splitter connection 509, which splits the input coolant liquid between cold plates 505a and 505b. Similarly, the output coolant lines from cold plates 505a and 505b are coupled to a combiner connection 510, which couples both lines to output quick connect fitting 511. This configuration provides twice as much coolant liquid to the GPU cold plates 503a-d compared to the amount of coolant liquid received at CPU cold plates 505a-b.

In other embodiments, instead of using a splitter 509 or combiner 510 connection, septate coolant lines could be routed to each CPU cold plate 505a-b, such as by connecting to the unused pair of input/output fittings on manifold 501. The amount of cooling liquid provided to each CPU cold plate 505a-b could be reduced relative to the amount provided to GPU cold plates 503a-d by adjusting the size of the quick disconnect fittings on manifold 501 or by restricting the orifice on fittings coupled to the CPU cold plates 505a-b.

Figure 6:
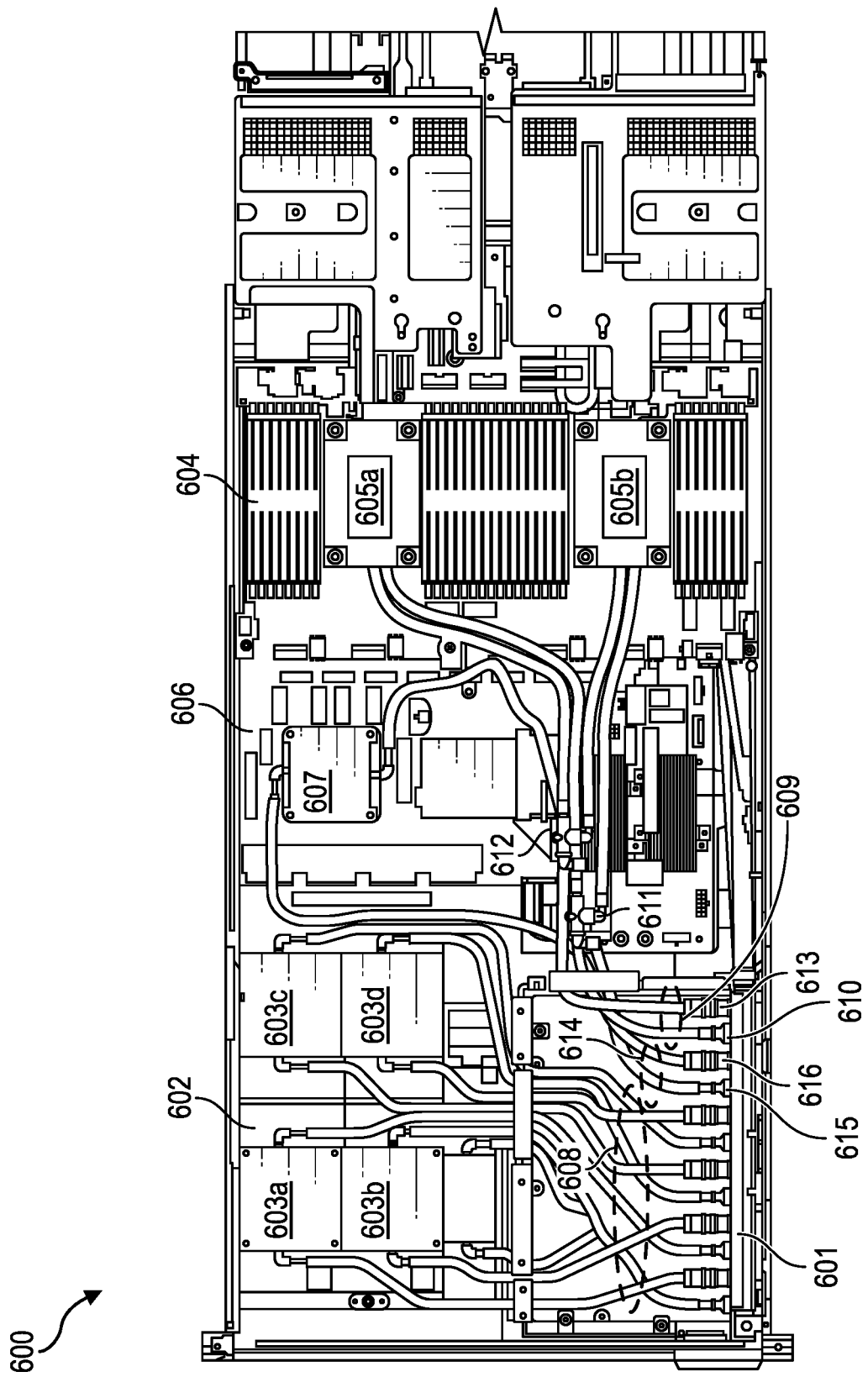
FIG. 6 is a top view of an IT enclosure illustrating a cooling liquid manifold configuration according to a further example embodiment.

FIG. 6 is a top view of an IT enclosure illustrating a cooling liquid manifold configuration according to a further example embodiment. IT enclosure 600 has a liquid cooling manifold 601 with six pairs of input/output fittings. A GPU module 602 has four GPUs with cold plates 603a-d. A separate CPU module 604 has two CPUs with cold plates 605a-b. GPU module 602 and CPU module 604 may be on the same level within IP enclosure 600. Alternatively, the CPU module 604 may be on a level that is above or below the GPU module 602 within IT enclosure 600. A switch board 606 with cold plate 607 is also installed within IT enclosure 600.

Internal liquid cooling manifold 601 can be configured to support these different types of components, such as GPUs, CPUs, and switch plate, which each have different power requirements and different thermal solutions.

Manifold 601 has four pairs of input/output coolant lines 608 servicing the GPU cold plates 603a-d. Each cold plate 603a-d is coupled to a dedicated input coolant line and a dedicated output coolant line. Another pair of coolant lines 609 are configured to service CPU cold plates 605a-b. Input quick connect fitting 610 is coupled to a single line that is in turn coupled to a splitter connection 611, which splits the input coolant liquid between cold plates 605a and 605b. Similarly, the output coolant lines from cold plates 605a and 605b are coupled to a combiner connection 612, which couples both lines to output quick connect fitting 613. Another pair of coolant lines 614 are used to provide cooling liquid to and from switch board 606 and cold plate 607. Input quick connect fitting 615 and output quick connect fitting 616 control how much cooling fluid is provided to cold plate 607.

In one embodiment, this configuration provides twice as much coolant liquid to the GPU cold plates 603a-d and switch board cold plate 607 compared to the amount of coolant liquid received at CPU cold plates 605a-b. In other embodiments, instead of using a splitter 609 or combiner 610 connection, septate coolant lines could be routed to each CPU cold plate 605a-b, such as by connecting to the unused pair of input/output fittings if manifold 601 had seven or more pairs of quick connect fittings. The amount of cooling liquid provided to each CPU cold plate 605a-b and/or cold plate 607 may be reduced relative to the amount provided to GPU cold plates 603a-d by adjusting the size of the quick disconnect fittings 610, 613, 615, 616 on manifold 601 or by restricting the orifice on fittings coupled to CPU cold plates 605a-b and/or switch board cold plate 607.

As illustrated in FIGS. 5 and 6, the internal liquid coolant manifold disclosed herein provides a flexible configurations for different cooling solutions as required by different IT gear configurations. The internal liquid coolant manifold can be used to simultaneously support different processor/compute boards and different support boards in the same chassis.

The quick disconnects on each branch of the internal liquid coolant manifold allow for serviceability while minimizing disruption to other parts of the system and while minimize the impacted area. The supply and return coolant lines can be keyed (e.g., male or female) to prevent cross connection. The internal liquid coolant manifold maybe configured with additional ports to provide for future expansion and increased leverage of the IT enclosure. The input/output quick connect fittings may be individually tuned to control the liquid coolant flow to each component through fitting sizing or orifice restrictions. The components of the liquid coolant system are replaceable and upgradable without impacting the rest of the system when the internal liquid coolant manifold is used.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises,"

"has," "includes" or "contains" one or more operations possesses those one or more operations but is not limited to possessing only those one or more operations.

What is claimed is:

1. An information technology (IT) equipment enclosure, comprising:
a plurality of IT components;
cold plates disposed over at least two of the IT components; and
a cooling fluid manifold disposed within the IT equipment enclosure, the coolant liquid manifold having two or more input connectors and two or more output connectors, wherein each of the cold plates are coupled to the cooling fluid manifold using a coolant line attached to one of the input connectors and a coolant line attached to one of the output connectors, and wherein the input connectors are a first type of quick disconnect fitting and the output connectors are a second type of quick disconnect fitting, and wherein the first and second type of quick disconnect fittings are not interchangeable.

2. The IT equipment enclosure of claim 1, further comprising:
an input cooling liquid line coupled to the coolant liquid manifold; and
an output liquid line coupled to the coolant liquid.

3. The IT equipment enclosure of claim 2, wherein the coolant liquid manifold is configured to receive cooling fluid and to distribute the cooling fluid to all of the cold plates in the enclosure via the input connectors.

4. The IT equipment enclosure of claim 2, wherein the coolant liquid manifold is configured to receive warmed cooling fluid from all of the cold plates in the enclosure.

5. The IT equipment of claim 1, wherein the input connectors and the output connectors are quick disconnect fittings adapted to be coupled to coolant lines routed to the cold plates.

6. The IT equipment of claim 1, wherein the first type of quick disconnect fitting is selected from a male or female fitting, and where the second type of quick disconnect fitting is an opposite type of female or male fitting.

7. The IT equipment of claim 1, wherein an amount of cooling fluid provided by the coolant liquid manifold to individual cold plates is determined by a size of an associated input connector.

8. The IT equipment of claim 1, wherein an amount of cooling fluid provided by the coolant liquid manifold to individual cold plates is determined by an orifice restriction applied to an associated input connector.

9. The IT equipment of claim 1, wherein the IT components are one or more of a Central Processing Unit (CPU), Graphics Processing Unit (GPU), a compute module, and a switch module.

10. The IT equipment of claim 1, further comprising:
a fluid splitter coupled to an input connection on the coolant liquid manifold, wherein the fluid splitter has two or more outputs;
a first cold plate coupled to a first output of the fluid splitter; and
a second cold plate coupled to a second output of the fluid splitter.

11. The IT equipment of claim 10, wherein the fluid splitter is configured to divide cooling liquid from the coolant liquid manifold between the first cold plate and second cold plate.

12. A computing rack, comprising:
a frame structure configured for mounting one or more chassis, each chassis configured for mounting IT components;
a liquid cooling system configured to provide cooling fluid to the one or a plurality of IT components;
at least one of the one or more chassis comprising:
cold plates disposed over the IT components; and
a cooling fluid manifold disposed within the chassis, the coolant liquid manifold having a plurality of input connectors and a plurality of output connectors, wherein each of the cold plates are coupled to an input connector and an output connector on the cooling fluid manifold using a coolant line attached to one of the input connectors and a coolant line attached to one of the output connectors, and wherein an amount of cooling fluid provided by the coolant liquid manifold to individual cold plates is determined by a size of an associated input connector.

13. The computing rack of claim 12, further comprising:
input lines coupling the liquid cooling system to the input connector on each coolant liquid manifold, wherein the coolant liquid manifold is configured to receive cooling fluid from the liquid cooling system; and
output lines coupling the output connector on each coolant fluid manifold to the liquid cooling system, wherein the coolant liquid manifold is configured to provide the cooling fluid to the liquid cooling system after passing through the cold plates.

14. The computing rack of claim 12, wherein the coolant liquid manifold is configured to receive warmed cooling fluid from all of the cold plates in the enclosure and to send the warmed cooling fluid to the liquid cooling system.

15. The computing rack of claim 12, wherein the input connectors and the output connectors are quick disconnect fittings adapted to be coupled to coolant lines routed to the cold plates.

16. The computing rack of claim 12, wherein the input connectors are a first type of quick disconnect fitting and the output connectors are a second type of quick disconnect fitting, and wherein the first and second type of quick disconnect fittings are not interchangeable.

17. The computing rack of claim 12, wherein an amount of cooling fluid provided by the coolant liquid manifold to individual cold plates is determined by an orifice restriction applied to an associated input connector.

18. The computing rack of claim 12, further comprising:
a fluid splitter within at least one chassis, the fluid splitter coupled to an input connection on the coolant liquid manifold, wherein the fluid splitter has two or more outputs;
a first cold plate within the at least one chassis and coupled to a first output of the fluid splitter; and
a second cold plate within the at least one chassis and coupled to a second output of the fluid splitter,
wherein the fluid splitter is configured to divide cooling liquid from the coolant liquid manifold between the first cold plate and second cold plate.

19. An information technology (IT) equipment enclosure, comprising:
a plurality of IT components; a cooling fluid manifold disposed within the IT equipment enclosure, the coolant liquid manifold having two or more input connectors and two or more output connectors, wherein each of the cold plates are coupled to the cooling fluid manifold using a coolant line attached to one of the input connectors and a coolant line attached to one of the output connectors; and a fluid splitter coupled to an input connection on the coolant liquid manifold, wherein the fluid splitter has two or more outputs;

a first cold plate disposed over a first of the IT components and coupled to a first output of the fluid splitter; and a second cold plate disposed over a second of the IT components and coupled to a second output of the fluid splitter.

* * * * *